United States Patent [19]

Belet et al.

[11] 3,737,893

[45] June 5, 1973

[54] BIPOLAR CONVERSION ANALOG-TO-DIGITAL CONVERTER

[75] Inventors: Joseph J. Belet, Delray Beach; Jack L. Quanstrom, Boca Raton, both of Fla.

[73] Assignee: International Business Machines Corporation, Armonk, N.Y.

[22] Filed: Apr. 6, 1971

[21] Appl. No.: 131,749

[52] U.S. Cl. ....................... 340/347 NT, 340/347 CC

[51] Int. Cl. ............................................... H03k 13/02

[58] Field of Search .................340/347 AD, 347 NT, 340/347 CC; 235/92 CC; 320/1; 307/236; 324/115

[56] References Cited

UNITED STATES PATENTS

| | | | |
|---|---|---|---|
| 2,824,285 | 2/1958 | Hunt | 340/347 CC |
| 3,436,756 | 4/1969 | Myers | 340/347 CC |
| 3,564,430 | 2/1971 | Brudevold | 307/236 |
| 3,544,993 | 12/1970 | Gabriel | 340/347 AD |
| 2,999,968 | 9/1961 | Weiss | 320/1 |
| 3,603,773 | 9/1971 | Carlstein | 235/92 CC |

*Primary Examiner*—Maynard R. Wilbur
*Assistant Examiner*—Jeremiah Glassman
*Attorney*—Hanifin & Jancin and Earl C. Hancock

[57] ABSTRACT

Bipolar analog input signals are tested for apparent polarity, and depending on the polarity indication, the analog signal is either inverted or not inverted and resulting input signal is combined with a constant reference voltage so that the effective input to the analog-to-digital converter will always be a unipolar voltage having a minimum nominal value greater than the potential error of the polarity decision element. A counter or register type output device, which reflects the digital resultant from the conversion, is corrected by subtracting the digital equivalent of the constant reference voltage, either by presetting the counter to an initial negative value or by subtraction following the conversion. The initial polarity decision further controls the readout, either direct or complemented, to correspond to the apparent polarity of the input signal.

9 Claims, 4 Drawing Figures

INVENTORS
JOSEPH J. BELET
JACK L. QUANSTROM

BY Carl C. Hancock
ATTORNEY

BIPOLAR CONVERSION ANALOG-TO-DIGITAL CONVERTER

CROSS REFERENCES TO RELATED APPLICATIONS

This invention is particularly useful in conjunction with multi-ramp integrating analog-to-digital converters such as are shown in (1) Application Ser. No. 649,161 entitled, "Triple Integrating Ramp Analog to Digital Converter", by H. B. Aasnaes filed June 27, 1967, now U.S. Pat. No. 3,577,140 and assigned to the same assignee as this application, and (2) Application Ser. No. 131,748 entitled, "Improved Analog-to-Digital Converter Circuits", by G. A. Hellwarth and J. E. Milton filed concurrently with this application and also assigned to the same assignee as this application.

BACKGROUND OF THE INVENTION

1. Field of the Invention

This invention relates to circuits for converting sampled analog signals into an appropriate format for use in digital data handling equipment. More particularly, this invention is concerned with analog-to-digital converters which must convert analog input signals that are of positive, negative or zero levels into digital representations of that analog input. The invention is particularly useful for handling bipolar analog input signals in a manner which is relatively independent of the specific polarity or magnitude of that signal.

2. Description of the Prior Art

Many functions are monitored by sensing devices which produce an analog signal corresponding in magnitude to the status of the function at a given time. These analog signals frequently must be converted to a digital format which will permit handling by digital data equipment of various types. There are generally acceptable analog-to-digital converter (ADC) circuits in the prior art which can adequately handle such analog signals provided they are unipolar in nature. Many sensors and functions being monitored require that the circuitry be capable of handling analog signals of either polarity, however.

Each of the attempts to handle bipolar analog input signals has encountered a significant disadvantage. For instance, some analog to digital converters employ reference voltages of opposite polarities to be compared against the analog signal with detection circuitry for determining initially which polarity is present at the input and thence switching in the appropriate reference level polarity for comparison purposes. Each of the reference sources can drift independently in this apparatus so that conversion of equal magnitudes but opposite polarities can frequently result in different digital output manifestations. In addition to the requirement for redundant reference supplies, these circuits also have a region of uncertainty or dead band above and below zero which results from the particular comparator circuitry used to sample the polarity of the input. Further, it is difficult to design conversion circuitry which is symmetrical for both positive and negative conversions, thus originating yet another potential error in the conversion technique. U.S. Pat. No. 3,493,958, "Bipolar Analog to Digital Converter" issued Feb. 3, 1970 by Gorbatenko et al. shows a circuit for handling bipolar analog inputs with a successive approximation circuit with a relatively high degree of accuracy but involves relatively complex and involved circuitry to obtain this result.

Another solution which has been suggested is to utilize offset reference voltages such that the signal being converted is always of the same polarity. This imposes a relatively high bandwidth requirement particularly on integrating ADC type circuits or substantially reduces the range of analog signals which can be handled. One example of such an approach is shown in the September 1968 IBM Technical Disclosure Bulletin (Vol. 11 No. 4) in the article entitled "Integrating Ramp Analog-to-Digital Converter" by Aasnaes, Bartley, Harrison and Masterson. Still another approach is to provide constant polarity input signals to the ADC circuit by using a comparator to sense the analog polarity and invert the sampled signal when appropriate. Circuitry using such a polarity sensing arrangement for successive approximation type ADC systems are shown in the December 1959 IBM Technical Disclosure Bulletin in the article entitled "Bipolar Analog-Digital Conversion Circuit" by Margopoulous and Mazza at pages 133–134. Such approaches also suffer from the uncertainty or deadband above and below zero analog input due to comparator error or drifting. That is, it is difficult to design a comparator circuit which will always indicate the correct polarity for an analog signal which is a relatively small increment on either side of zero.

Accordingly, there is no ADC circuitry available in the prior art which can handle relatively wide ranges of analog input signals as well as bipolar analog input signals which are zero or vary by small increments on either side of zero.

SUMMARY OF THE INVENTION

The present invention is an analog-to-digital converter circuit which can successfully handle analog input signals whether they be positive, negative or zero. Positive and negative inputs are handled in a uniform fashion such that there is no basic difference between the conversion into a positive number or a negative number with regard to time or error effects. The negative conversion results can be presented in two's complement form and overflows can be appropriately indicated.

The circuitry in accordance with the present invention is adaptable for use in conjunction with a multi-ramp integrating ADC, a successive approximation ADC or the like. For instance, it can be adapted for use in conjunction with a multi-ramp integrating analog-to-digital converter such as is described in the aforementioned Aasnaes U.S. Pat. No. 3,577,140 and the detailed description of one preferred embodiment will be presented in a similar environment. A comparator circuit is used to provide an apparent indication of the analog sample polarity before a conversion cycle is performed and the accuracy of this comparator for small increments on either side of zero will not affect the accuracy of the resultant digital conversion. A standard reference voltage is combined with the analog sample at the ADC input so that the signal actually being converted is effectively the difference between the analog signal and that reference. This standard reference is chosen so as to be slightly greater than any predictable error of the comparator circuit for reasons that will be better understood in the detailed description. The polarity indicating output from the comparator is used to determine whether to directly couple the analog signal to the ADC input or to pass it through a unity gain inverter circuit so that the ADC will always be converting an apparent analog input of constant polarity when combined with the aforementioned standard reference. Counter circuits associated with the ADC are modified before readout to compensate for the reference voltage. For instance, the counter can be set with a preset count corresponding to the magnitude of the standard reference when used with a multi-ramp integrator ADC. Alternatively, the counter content can be decremented by an amount corresponding to the reference voltage as might be preferable for successive approximation ADC's. The comparator output is stored after the initial decision sampling and that stored result is subsequently used to select between direct counter readout, or complemented output again as a function of the apparent polarity. The ultimate digital readout signal will be an accurate representation of both the polarity of the analog sample and its magnitude even though the comparator may have initially indicated the wrong polarity for a small increment on either side of zero.

An object of this invention is to provide bipolar analog to digital conversion.

Another object of this invention is to convert analog signals of positive, negative or zero levels into digital representations corresponding to the magnitude and polarity of the input.

Yet another object of this invention is to accurately convert bipolar analog signals to digital representations with a relatively high degree of accuracy whether large analog signals of either polarity, small analog signals on either side of zero of either polarity or zero level signals are being sampled.

A further object of the present invention is to convert positive, negative or zero level analog signals to digital representations independently of variations of the polarity detection circuitry.

The foregoing and other objects, features, and advantages of the present invention will be apparent from the following more particular description of the preferred embodiment of the invention as is illustrated in the accompanying drawings.

DESCRIPTION OF PREFERRED EMBODIMENT

Figure 1:
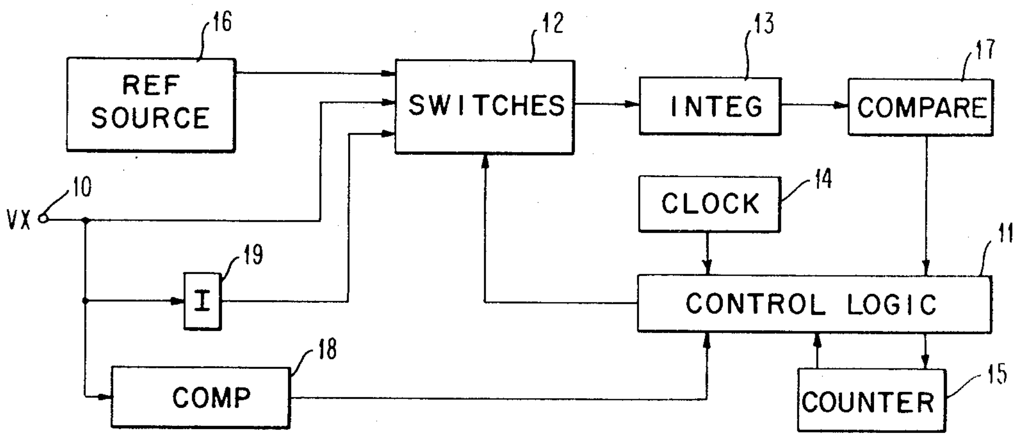
FIG. 1 presents a general block diagram of the main components associated with an embodiment of the present invention.

The general block diagram of FIG. 1 presents the main components associated with applying the present invention to a multi-ramp integrating analog-to-digital converter. The sampled unknown analog input signal, Vx, is coupled to terminal 10 and could be produced from any selected one of a multiplicity of sensor elements, such as from a multiplexer output, or the output of a single sensor could be attached to 10. As is known in the multi-ramp ADC art, the control logic 11 initiates a conversion cycle by closing an appropriate switch in switch matrix 12 so that Vx is introduced to integrator circuit 13. This initial integration will be performed for a fixed period of time such as is determined by the gating of pulses from clock 14 into counter 15 through control logic 11. When counter 15 has reached a predetermined count, control logic 11 will control switch matrix 12 so that Vx is no longer coupled to integrator 13 but a standard reference voltage from reference source 16 will be thus coupled to integrator 13. The voltage level of this reference is of opposite polarity from Vx so that the output of integrator 13 will begin decaying towards its original initial level.

Eventually, comparator circuit 17 will indicate that the output of integrator 13 has passed the initial threshold level and signal this event to control logic 11. Control logic 11 will gate pulses from clock 14 into counter 15 during the period that the reference voltage is being integrated and the final count at the time of the output from comparator 17 will reflect a digital signal corresponding to the magnitude of Vx. An ADC using only one reference potential from source 16 is referred to as a dual-ramp type integrating ADC. If two reference signals from source 16 for successive integration, a triple-ramp ADC is performed as is subsequently considered in detail for FIG. 3. However, the present invention is equally useful no matter how many ramps are used in such multi-ramp ADC systems.

As previously mentioned, the analog input Vx can be of either positive, negative or zero level. Since the voltage reference from 16 must be opposite polarity from that introduced to Vx in order for integrator 13 to be operable, means for accommodating the bipolar signals at Vx must be included. For this purpose, comparator 18 inspects the polarity of Vx prior to the initiation of an ADC cycle and generates an output signal to control logic 11 reflecting the apparent polarity as determined by comparator 18. Control logic 11 will store this indication such as by appropriate setting of a latch circuit and, if appropriate, will control switch matrix 12 so that the output of unity gain inverter 19 will be initially coupled during the first sampling time period to integrator 13 instead of the direct coupling of Vx. Thus, integrator 13 will always have an input to it of a constant polarity regardless of the specific polarity present at Vx.

Unity gain amplifiers or inverters for circuit 19 are available in the art such that the outputs thereof will be exactly the same magnitude as the input but of opposite polarity. The difficulty arises in comparator circuits such as comparator 18 wherein drifts, deadbands, and the like can result in an output being produced which is suggestive of an opposite polarity from that which is actually present at 10. This situation only arises for a relatively small magnitude of signal on either side of the zero level. The present invention accommodates this situation by using a differential input for integrator 13 and by combining the output of Vx or inverter 19 from switch matrix 12 with a constant level reference voltage which exceeds the deadband region that might be encountered in comparator 18. To compensate for this standard reference voltage, used to generate the differential input for integrator 13, counter 15 is set so as to effectively indicate a negative count prior to the initiation of a conversion cycle. Thus counter 15 must be incremented to a first overflow condition from clock 14 before counts reflecting a positive magnitude will be stored. This means that an erroneous indication of polarity by comparator 18 will be automatically corrected by the fact that a small negative number will result in counter 15 from the failure to overflow and thus the count contained in counter 15 will in fact, and in conjunction with the initial polarity indication, represent both the polarity and magnitude of the input Vx.

After a conversion cycle has been completed, the counter 15 will contain, depending on the polarity indication from comparator 18, either the true digital representation, be it positive or negative in two's complement form, or the one's complement of the true digital value. In the latter case the contents of counter 15 are complemented prior to readout through logic controlled by the stored polarity indication.

Figure 2:
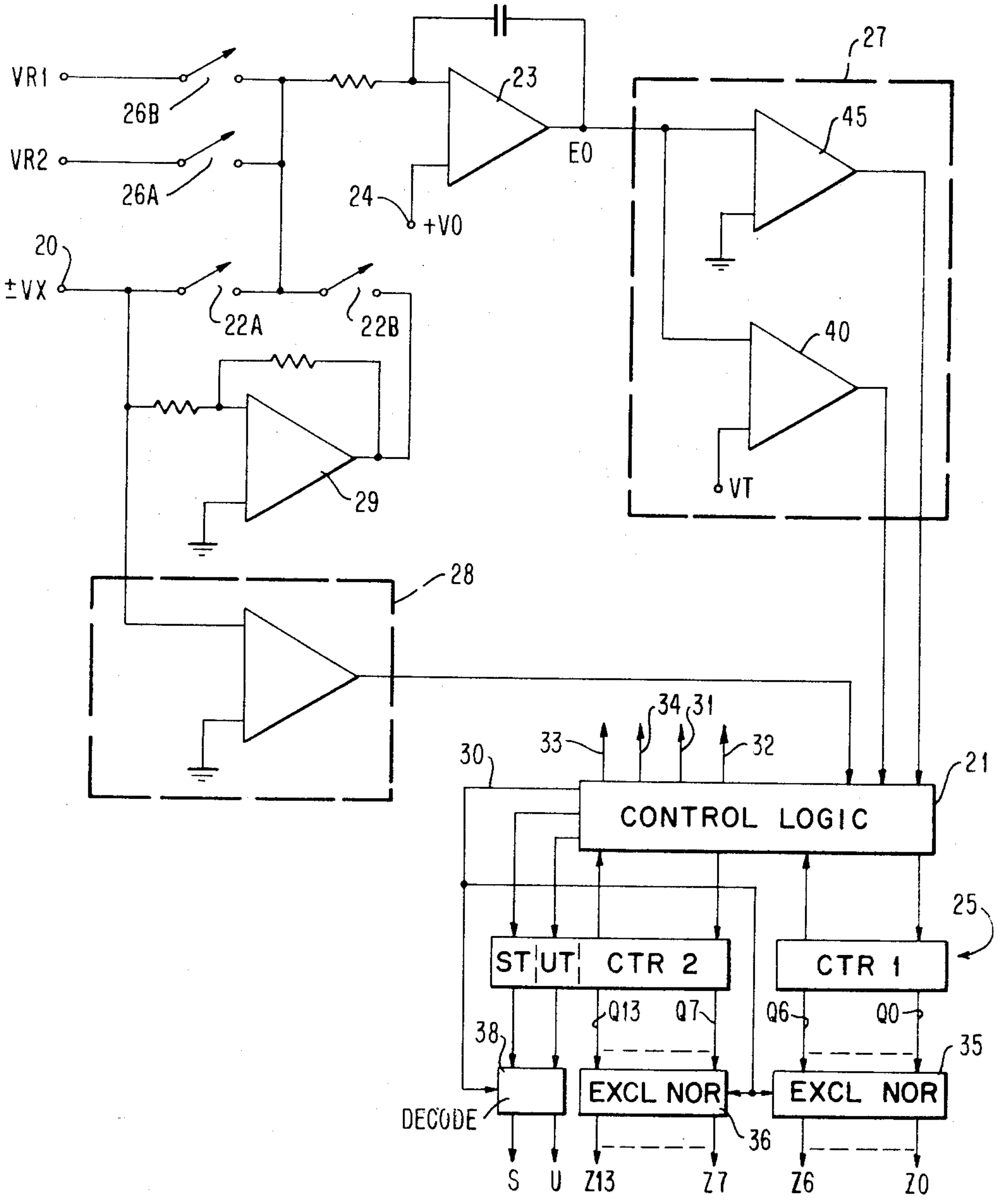
FIG. 2 is a circuit diagram of an embodiment of this invention particularly showing the operations thereof for use in conjunction with a triple-ramp integrating analog-to-digital converter.

FIG. 2 illustrates the basic components of the present invention as they might be applied in conjunction with a triple-ramp ADC for bipolar analog input handling purposes. It should be recognized that the principles of the present invention are equally applicable to bipolar conversion of dual ramp, triple ramp or any other multiple ramp integrating ADC operation. The basic operation of a triple ramp ADC is described in the cross-referenced Aasnaes U.S. Pat. No. 3,577,140. The bipolar conversion in accordance with this invention uses the same basic components with some additional features, some of which have been generally treated in the foregoing description for FIG. 1.

The FIG. 2 circuitry includes comparator 28 which inspects and determines the apparent polarity of the analog input signal Vx at terminal 20. Unity-gain inverting amplifier 29 inverts the input signal under appropriate circumstances similar to inverter 19 of FIG. 1. Analog input switches 22A and 22B are controlled by output signals 31 and 32, respectively, from control logic 21. During the sampling interval, 21 will close either 22A to directly couple Vx to the input of integrator 23 or switch 22B will be closed so that the inverted equivalent of Vx will be coupled to the input of integrator 23 depending on the apparent polarity indicated by the output of comparator 28. A voltage offset, +Vo, is introduced to terminal 24 of integrating amplifier 23 with the magnitude of Vo being greater than the maximum error tolerance of comparator circuit 28. Control logic 21 also includes a means of presetting the counter 25 which is shown as composed of two sections (counter 1 and counter 2) to a negative value, in two's complement form, scaled to be equivalent in magnitude to the voltage offset Vo. Exclusive-NOR logic circuits 35 and 36 complement the output of the counter 25 whenever comparator 28 indicates conversion of a negative input voltage at Vx. Two flip-flops, ST and UT, are included as an extension of the counter 25 and are decoded by decoder 38 to provide sign (S) and overflow (U) information.

As is understood in the art, multi-ramp ADC circuits generally develop a count in an output counter or counters which is proportional to the input analog voltage. The triple ramp converter output is contained in two counters, 1 and 2, which are combined and read out as a single register at the end of the conversion.

At the start of conversion, counters 1 and 2 are preset to a bit pattern which is the two's complement equivalent to the magnitude of the integrator offset voltage Vo as determined by the scaling factor of the ADC. By way of example, it will be assumed that counters 1 and 2 with bit positions ST and UT represent a 16 bit register 25 with the bit positions of counter 2 containing the high order bit positions and the bit positions of counter 1 representing the low order. The preset would be effected at the end of the period for sampling Vx by placing one's in ST, UT and the high order positions of counter 2. Counter 2 is incremented by clock pulses to the exclusion of counter 1 during integration of the larger reference voltage VR2 whereas counter 1 is incremented during integration of VR1. Although an overflow from counter 2 after preset clears ST and UT, the overflows of counter 1 add an increment to the low order position of counter 2. Thus, the number of clock pulses that must be introduced to counter 1 or counter 2 to complete an initial overflow from counter 2 after preset will correspond to the magnitude of Vo.

Comparator 28 detects the polarity of the analog input voltage Vx and sets the state of a polarity indicating flip-flop in control logic 21. The state of this flip-flop is retained throughout conversion regardless of possible subsequent changes in the state of the output from comparator 28 and determines which of two conversion modes will take effect. For the sake of simplifying the explanation, it will be assumed that the indication of a positive input voltage by the output of comparator 28 will set the polarity flip-flop while indications of a negative input will force it to a reset or "zero" state. The level of line 30 represents the logic state of this polarity flip-flop such that a "1" on 30 corresponds to detection of a positive input voltage by 28. Note that, due to threshold inaccuracy of comparator 28, line 30 may be set to the "1" or positive state even though the input is actually negative. This decision error is automatically compensated by the bipolar conversion as will be discussed hereinafter.

Depending on the state of line 30, the input Vx may be inverted by unity-gain inverting amplifier 29. This would be effected by a signal from control logic 21 on line 32 for closing switch 22B. It will be assumed that this occurs whenever line 30 is at a "1" so that the actual input to the summing node of integrator 23 due to Vx is intended to always be negative. Further, the slope of the integrator output corresponding to the integration of Vx or its inverted value is always positive or upward. The following is a truth table which summarizes the results of each of the possible combinations of indicator bits, ST and UT, and input polarity, and shows the states of the sign bit, S, and overflow bit, U, as functions of line 30, St, and UT, together with their respective interpretations.

TABLE I

| 30 | ST | UT | S | U | Output |
|---|---|---|---|---|---|
| 0 | 0 | 0 | 1 | 0 | Negative |
| 0 | 0 | 1 | 1 | 1 | Neg. Overflow |
| 0 | 1 | 1 | 0 | 0 | Positive |
| 1 | 0 | 0 | 0 | 0 | Positive |
| 1 | 0 | 1 | 0 | 1 | Pos. Overflow |
| 1 | 1 | 1 | 1 | 0 | Negative |

Table I provides the basis for the derivation of the following logic equations, defining U and S:

$$S = \overline{30}\ \overline{ST} + 30\ ST$$

$$U = \overline{ST}\ UT$$

As long as saturation of the ADC components such as integrator amplifier 23 occurs at least slightly under twice full scale voltage (VFS), a third overflow of counter 2 cannot happen. Since the second overflow indicates that the ADC has been overdriven and that the apparent resulting data is in error, it is only necessary to include means for storing an indication of the happening of this second overflow to flag such an error. Accordingly, a third overflow could be ignored even if it could happen.

When comparator 28 indicates a negative input Vx at the beginning of a conversion cycle, line 30 is reset to zero, and the following illustrate potential situations which might occur:

1. Vx equals 0. In this case, the effective input to integrator 23 is equal to −Vo and conversion of this value exactly cancels the preset negative number in counter 25. Accordingly, the final value in the counter at the end of the conversion is 0, which corresponds to the magnitude of Vx.

2. Vx is positive by a small amount due to comparator 28 error. The effective input to integrator 23 is less than Vo in magnitude so the final value in the counter is a negative number equal in magnitude to the scaled value of the positive input voltage Vx.

3. Vx is negative. The effective input is greater than the magnitude of Vo. Conversion cancels the initial preset negative number and produces a final positive number in the counter equal in magnitude to the scaled value of the negative input.

4. Vx is negative and produces an overflow condition. The counter actually overflows twice under this situation. The first overflow is the result of cancelling the preset negative number and the second overflow is the result of the input exceeding the capacity of the counter. In the second case, the temporary sign and overflow bits ST and UT are decoded to provide an overflow signal. This is indicated in the second horizontal row of the above truth table.

At the end of the conversion, each bit of counter 25 is read out through exclusive-NOR circuits 35 and 36 which complement the value in the counter if line 30 equals 0. Thus, the results of a positive input appearing in the counter as a two's complement number as specified for item 2 above is complemented and read out as a true positive number while the result of a negative number in accordance with item 3 above which appears in the counter as a positive number is read out as a two's complement negative number. Actually, complementation by the exclusive-NOR circuits produces a one's complement of the number in the counter. However, the difference between one's complement and two's complement is a single-bit offset error which is easily compensated by conventional offset adjustments of the ADC and inverting amplifier. The exclusive-NOR logic 35 and 36 responds to the fact that line 30 equals 0 to invert each bit of the counter 25 prior to readout instead of reflecting the actual contents, unchanged, as would occur if line 30 were at a "1" level. The following equation defines the state of each output bit, Z, of the exclusive-NOR logic as a function of the corresponding counter output bit, Q, and the state of line 30.

$$Z = \overline{30} \cdot \overline{Q} + 30 \cdot Q$$

The following table defines the status of each bit at the readout in accordance with the foregoing equation:

TABLE II

| 30 | Q | Z |
|---|---|---|
| 0 | 0 | 1 |
| 0 | 1 | 0 |
| 1 | 0 | 0 |
| 1 | 1 | 1 |

If comparator 28 initially indicates a positive input such that there is a 1 on line 30, the input voltage is inverted before integration by control logic 21 raising a signal on line 32 to close switch 22B. The same analysis as was presented above applies to the inverted values in that there are also four possible similar cases. However, in this event, the final values in the counters are a true representation of the input voltage Vx and are not complemented prior to readout. For example, if the polarity indication is in error, the small negative input value is inverted and appears to the converter as a positive input as in the second case described above when line 30 equals 0. This produces a two's complement result in counter 25 which is read out directly as the correct representation of the negative input value even though the comparator was in error in its initial polarity determination. As noted in the foregoing Table I, the decoding of the ST and UT indicator bits together with line 30 determines the correct sign and overflow indications for all cases.

Figure 3:
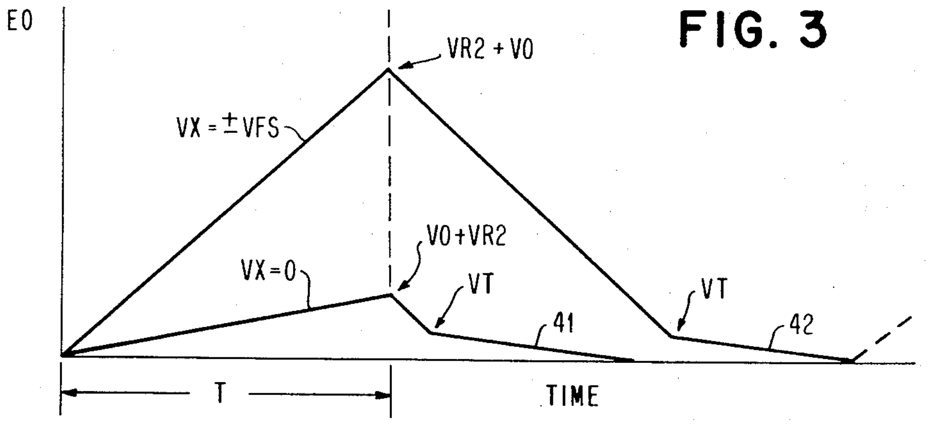
FIG. 3 is a time-base diagram of typical output signals from the integrator circuit utilized in the FIG. 2 circuit.

The operation of a triple ramp ADC as shown in FIG. 2 will now be briefly summarized. Initially the analog input Vx is introduced to 20 and, as a function of the output of comparator 28, is either coupled directly through the closing of switch 22A under control of logic 21 output 31 or inverted through the closing of switch 22B into integrator 23. A fixed time period T for sampling this input is determined by the control logic 21. For instance, counter 2 might be directly incremented from a clock and, when it produces an overflow, can cause the switch 22A or 22B to be opened. This determines the end of the sampling period T as shown in FIG. 3. Note that FIG. 3 illustrates the output of integrator 23 against time for two different cases, one where Vx equals 0 and the other where Vx equals a positive or negative full scale magnitude.

After period T is completed, the control logic would generate a signal on line 33 which causes switch 26A to close thus introducing a large reference voltage VR2 to the input of integrator 23. This reference voltage is of opposite polarity from that which was introduced to integrator 23 during the fixed sampling period. Thus, the output will descend linearly with a relatively steep slope as is shown in FIG. 3. Note that the negative presetting of counter 25 and bits ST and UT to reflect offset voltage Vo is performed by control logic 21 at the same time switch 26A is actuated. Eventually the output Eo of integrator 23 will drop below a threshold value VT. Up until this time, the control logic has again been incrementing counter 2 with pulses from a clock source at the same rate as was used to determine period T and counter 25 may or may not have generated an initial overflow depending upon the magnitude of Vx. Counter 2 which was cleared and preset at the end of time T, since its overflow flagged the end of sample period T, is subsequently further incremented by these clock pulses during the time that VR2 is coupled to integrator 23, which is a variable period as a function of the original magnitude of Vx. As can be seen from Table I, the first overflow of counter 25 which resets UT and ST is interpreted as polarity defining data whereas a second overflow which again sets UT designates that Vx exceeds the ADC capacity.

After the threshold defined by VT has been sensed by an output from comparator circuit 40, the output 34 from control logic 21 opens switch 26A and closes switch 26B so that a smaller reference voltage level VR1 is thence coupled to integrator 23. At that time, pulses will begin to be incremented into counter 1 instead of counter 2. The same conditions for interpreting the first and second overflows exist as discussed above for counter 2 but, in this case, the overflows of counter 1 merely increment the low order stage of counter 2. Thus counter 1 and counter 2 function as a single counter which requires an overflow from counter 2 before any interpreting change occurs. The slower descent of Eo shown in FIG. 3 at 41 and 42 corresponds to the smaller magnitude of VR1. Ultimately the output Eo will reach the original starting reference level (ground in this case), will be sensed by comparator 45 and thus a signal generated to control logic 21 to drop the control line 34 and open switch 26B. This further indicates that the conversion cycle has been completed and that the combined contents of counter 1, counter 2, ST and UT represent the results of the conversion. Note that the switching between VR2 and VR1 occur upon the next count into counter 2 after VT has been passed so that the integration times for 41 and 42 are not necessarily the same. Simple analysis of the operations described shows that the total count into counter 25 is proportional to the magnitude of the effective input.

Figure 4:
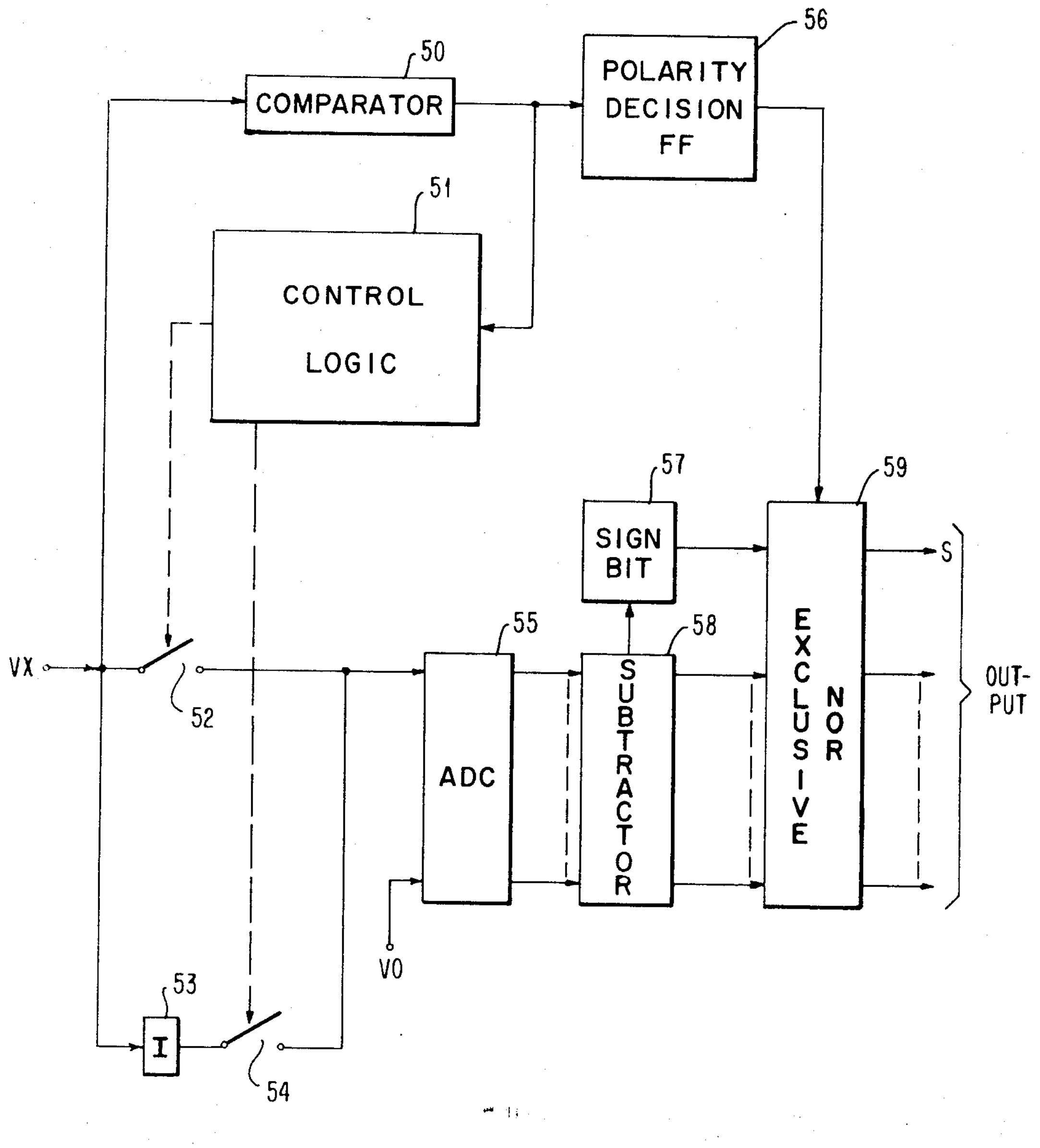
FIG. 4 is a general block diagram of a potential embodiment of this invention in conjunction with any ADC, such as the successive approximation type.

Because of the fact that the prior art offset method of achieving bipolar operation doubles the conversion time for the same degree of resolution, the present invention is particularly advantageous for ramp-type converters. However, it should be noted that the basic principles of the invention are applicable to practically any type of ADC. FIG. 4 illustrates how this method of achieving bipolar conversion might be applied to a successive approximation ADC. For purposes of the FIG. 4 example, it is assumed that the basic ADC 55 is unipolar and develops an output into some form of binary digital register capable of being designed to perform as a decrementing counter. Note that the offset reference voltage Vo can be added to Vx for the successive approximation embodiment by any of a variety of well-known means. For instance, a differential amplifier or simple summing network can be used for this purpose.

The only basic difference between this type of implementation and that used with the ramp-type ADC is in the arrangement used for subtracting the effect of the input offset voltage Vo. In the ramp converter it is feasible to perform the subtraction by presetting the counter to a negative value prior to the conversion cycle. In a successive approximation ADC this is not generally practical because the output is repeatedly compared with the input with the object of developing a final value in the output register equivalent to the effective input. Thus the contents of the output register for ADC 55 must not be altered until the successive approximation process is completed.

However, it is possible to perform the subtraction at the end of the successive approximation cycle. This may be accomplished by designing the subtractor or output register 58 as a simple ripple-through, decrementing counter, such that a pulse applied at the appropriate bit level will have the same effect as subtracting a binary quantity equivalent to the weight or value of the bit, or register flip flop, to which the decrementing pulse is applied. For example, a pulse introduced at the third from the lowest order bit would be equivalent to subtracting 4 from the final value, introduced at the next higher bit level, it would subtract 8, and so on. Thus for a ten-bit converter having a resolution of one part in 1024 and a full scale input of 10.24 volts, the least significant bit would have a value of 10 mV. If it were desired to make Vo = 160 mV, which should be sufficient to span the inaccuracy of the worst comparator, this value could be corrected by introducing a decrementing pulse at the fifth bit position.

Polarity sampling comparator 50 functions for the FIG. 4 embodiment in the same manner as discussed for FIGS. 1 and 2. Likewise, control logic 51 responds to this polarity sampling to determine whether to directly couple Vx to ADC 55 by closing switch 52 or pass it through unity-gain inverter 53 by closing switch 54. The initial polarity sampling also determines whether or not to set polarity decision flip-flop 56. As for the other embodiments, the digital output is interpreted through exclusive-NOR logic 59 as a function of the state of flip-flop 56.

While the invention has been particularly described and shown relative to the foregoing embodiments, it will be understood by those having normal skill in the art that various other changes and modifications may be made without departing from the spirit of the invention. For instance, some ADC systems perform one conversion to determine an appropriate level of attenuation or amplification to be used for a given unknown analog input so that the second conversion can be performed at an optimum resolution level. In such systems, the polarity determination result can be used for both conversions if the original analog signal magnitude is large enough. Further, the polarity determination can be stored and used for multiple cycles such as where it is known that a group of multiplexer outputs are all of the same polarity but that polarity is not initially known.

What is claimed is:

1. An apparatus operable in conjunction with an analog to digital converter which employs a conversion cycle to convert unknown analog signals into digital manifestations comprising means operable prior to a said conversion cycle for sensing the polarity of said unknown analog signal and for producing an output indicative thereof, means for inverting said unknown analog signal to an output of like magnitude but opposite polarity, switching means for connecting either said unknown analog signal or said inverting means output to the input of said converter, control means responsive to said polarity sensing output for actuating said switching means for coupling a constant polarity input to said converter during the period of the conversion cycle that the analog signal is to be sampled, a reference signal source of a magnitude greater than any said unknown analog input signal that could cause an incorrect polarity indication output by said polarity sensing means, means for combining said reference signal with the said switching means input to said converter, and means responsive to said polarity sensing means output for reflecting the true polarity of the unknown analog signal and including means for correcting the digital manifestation produced by said converter by an amount correlated to the magnitude of said reference signal.

2. Apparatus in accordance with claim 1 wherein said sensing means includes
means for storing the results of said polarity sensing at least until the end of the immediately following conversion cycle.

3. Apparatus in accordance with claim 2 which further includes
logic means for providing a final said digital manifestation which is a function of the state of said storing means and the digital results of said immediately following conversion cycle.

4. Apparatus in accordance with claim 1 wherein said converter employs a counter circuit for developing said digital manifestation during a conversion cycle and wherein said correcting means includes
means operable prior to commencement of the operation of said counter for developing said digital manifestation for introducing digital data to said counter so as to compensate for the magnitude of said reference signal.

5. Apparatus in accordance with claim 4 wherein said sensing means includes
means for storing the polarity sensing results, said apparatus further including
logic means coupled to the output of said counter and said storing means for providing a digital manifestation output at the end of a conversion cycle in the correct format as a function of the state of said storing means.

6. Apparatus in accordance with claim 1 wherein said converter employs a register or counter type circuit for presenting the digital manifestation results of each conversion cycle, said correcting means including
subtractive logic means for reducing the content of said register at the end of each conversion cycle by an amount digitally correlated to the magnitude of said reference signal.

7. Apparatus in accordance with claim 6 wherein said sensing means includes
means for storing the polarity sensing results, said apparatus further including
interpreting logic means coupled to the output of said register as compensated by said subtractive logic means for providing a digital manifestation output at the end of each conversion cycle in the correct format indicated by the state of said storing means.

8. Apparatus in accordance with claim 1 wherein said inverting means includes
a unity gain amplifier coupled to receive said unknown analog signals.

9. In a multi-ramp analog to digital converter employing an integrator, at least one reference signal and a counter wherein a conversion cycle is effected by integrating the unknown analog input for a fixed period and thereafter switching to integrate said reference signal or signals while incrementing said counter so as to reflect the time required to return said integrator output to the same level as at the start of said fixed period, an improvement comprising
comparator means for receiving the unknown analog input and generating an output signal indicating the polarity thereof,
means operable prior to commencement of a said conversion cycle for storing said comparator means output for at least one succeeding conversion cycle,
unity gain inverting means, connected for receiving said unknown analog,
means operable during said fixed period in response to said storing means for either directly coupling the unknown analog to said integrator input or coupling the output of said inverter means thereto,
a source of offset voltage having a magnitude at least sufficiently large as the level at which said comparator means will operate substantially free from error,
means for combining said offset voltage with the input of said integrator so that said integrator will integrate the differential between said offset voltage and any other signal coupled to the input thereof,
means operable at the conclusion of said fixed period for presetting said counter to a count for compensating for said offset voltage, and logic circuit means for providing readout signals from said counter at the end of a conversion cycle in direct or complementary form as indicated by the state of said storing means.

* * * * *